US009673188B2

United States Patent
Chen et al.

(10) Patent No.: US 9,673,188 B2
(45) Date of Patent: Jun. 6, 2017

(54) INTEGRATED ELECTROSTATIC DISCHARGE (ESD) CLAMPING FOR AN LDMOS TRANSISTOR DEVICE HAVING A BIPOLAR TRANSISTOR

(71) Applicants: Weize Chen, Phoenix, AZ (US); Patrice M. Parris, Phoenix, AZ (US)

(72) Inventors: Weize Chen, Phoenix, AZ (US); Patrice M. Parris, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 22 days.

(21) Appl. No.: 14/966,688

(22) Filed: Dec. 11, 2015

(65) Prior Publication Data
US 2016/0099240 A1 Apr. 7, 2016

Related U.S. Application Data

(62) Division of application No. 13/792,748, filed on Mar. 11, 2013, now Pat. No. 9,214,542.

(51) Int. Cl.
*H01L 27/07* (2006.01)
*H01L 27/02* (2006.01)
(Continued)

(52) U.S. Cl.
CPC .... *H01L 27/0259* (2013.01); *H01L 21/76224* (2013.01); *H01L 21/76895* (2013.01);
(Continued)

(58) Field of Classification Search
CPC ......... H01L 2924/0002; H01L 29/0653; H01L 29/1083; H01L 29/1045; H01L 27/0259;
(Continued)

(56) References Cited

U.S. PATENT DOCUMENTS 8,242,566 B2   8/2012 Zhan et al.
2009/0108346 A1*  4/2009 Cai ..................... H01L 27/0705
                                                            257/337
(Continued)

OTHER PUBLICATIONS

Jean-Philippe Laine et al., "Impact af Snapback Behavior on System Level ESD Performance with Single and Double Stack of Bipolar ESD Structures", conference publication, Electrical Overstress/ Electrostatic Discharge Symposium (EOS/ESD), Sep. 2012, pp. 1-5.

*Primary Examiner* — Benjamin Sandvik
*Assistant Examiner* — Damon Hillman

(57) ABSTRACT

A method of fabricating a laterally diffused metal-oxide-semiconductor (LDMOS) transistor device having a bipolar transistor for electrostatic discharge (ESD) protection includes doping a substrate to form a body region of the LDMOS transistor device in the substrate, the body region having a first conductivity type, forming a doped isolating region of the LDMOS transistor device in the substrate, the doped isolating region having a second conductivity type and surrounding a device area of the LDMOS transistor device in which the body region is disposed, forming a base contact region of the bipolar transistor, the base contact region being disposed within the body region and having the first conductivity type, and doping the substrate to form an isolation contact region for the doped isolating region that defines a collector region of the bipolar transistor, to form source and drain regions of the LDMOS transistor device in the substrate, and to form an emitter region of the bipolar transistor within the body region.

20 Claims, 3 Drawing Sheets

(51) Int. Cl.
  *H01L 21/762* (2006.01)
  *H01L 29/78* (2006.01)
  *H01L 29/66* (2006.01)
  *H01L 21/768* (2006.01)
  H01L 29/06 (2006.01)
  H01L 29/10 (2006.01)

(52) U.S. Cl.
  CPC ...... *H01L 27/0711* (2013.01); *H01L 29/0623* (2013.01); *H01L 29/0649* (2013.01); *H01L 29/1087* (2013.01); *H01L 29/6625* (2013.01); *H01L 29/66659* (2013.01); *H01L 29/66681* (2013.01); *H01L 29/78* (2013.01); *H01L 29/7835* (2013.01); *H01L 27/027* (2013.01); *H01L 27/0722* (2013.01); *H01L 29/0653* (2013.01); *H01L 29/1083* (2013.01)

(58) Field of Classification Search
  CPC ............. H01L 21/7622; H01L 29/1087; H01L 29/7835; H01L 29/78; H01L 27/0722; H01L 29/0649
  See application file for complete search history.

(56) References Cited

U.S. PATENT DOCUMENTS

2009/0224333 A1    9/2009  Lu et al.
2013/0270606 A1   10/2013  Chen et al.

* cited by examiner

INTEGRATED ELECTROSTATIC DISCHARGE (ESD) CLAMPING FOR AN LDMOS TRANSISTOR DEVICE HAVING A BIPOLAR TRANSISTOR

CROSS-REFERENCE TO RELATED APPLICATION

This application is a divisional application of U.S. application Ser. No. 13/792,748, entitled "Semiconductor Device with Integrated Electrostatic Discharge (ESD) Clamp" and filed Mar. 11, 2013, the entire disclosure of which is hereby incorporated by reference.

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS transistor device, a drift space is provided between the channel region and the drain region.

LDMOS transistor devices are often used in applications, such as automotive applications, involving operational voltage levels greater than 45 Volts. LDMOS transistor devices are designed to avoid breakdown events from the high electric fields resulting from such operational voltage levels.

LDMOS transistor and other integrated circuit (IC) devices remain at risk of breakdown damage due to electrostatic discharge (ESD) events. ESD events may be caused by an electrostatically charged person holding an IC chip. An ESD event may involve electrostatic potentials of 4000 Volts or more between input/output (I/O) terminals of the IC chip. During the ESD event, a discharge current typically flows between the I/O terminal and ground through vulnerable circuitry in the IC chip. Device degradation or failure may occur when ESD-based breakdown occurs along the current conduction path between the drain and source of an LDMOS device.

ESD protection devices are commonly incorporated into IC chips across terminals of the IC chip. ESD protection devices are often configured to provide another path to ground for the discharge current. For example, an ESD protection device may be connected between an I/O terminal and a ground or common terminal. The ESD protection device acts as a voltage limiter to prevent the voltage between the I/O terminal and the ground terminal from reaching levels that would otherwise harm other devices on the chip.

One type of ESD protection device is an ESD clamp. The clamp may be placed in parallel with the LDMOS transistor device and configured to breakdown at a lower level than the LDMOS transistor device. For example, the drain voltage of an LDMOS transistor device may be clamped to a level between the expected operating voltage of the LDMOS transistor device and the intrinsic breakdown voltage of the LDMOS transistor device. Unfortunately, ESD clamps often use up significant space and lead to additional fabrication costs.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
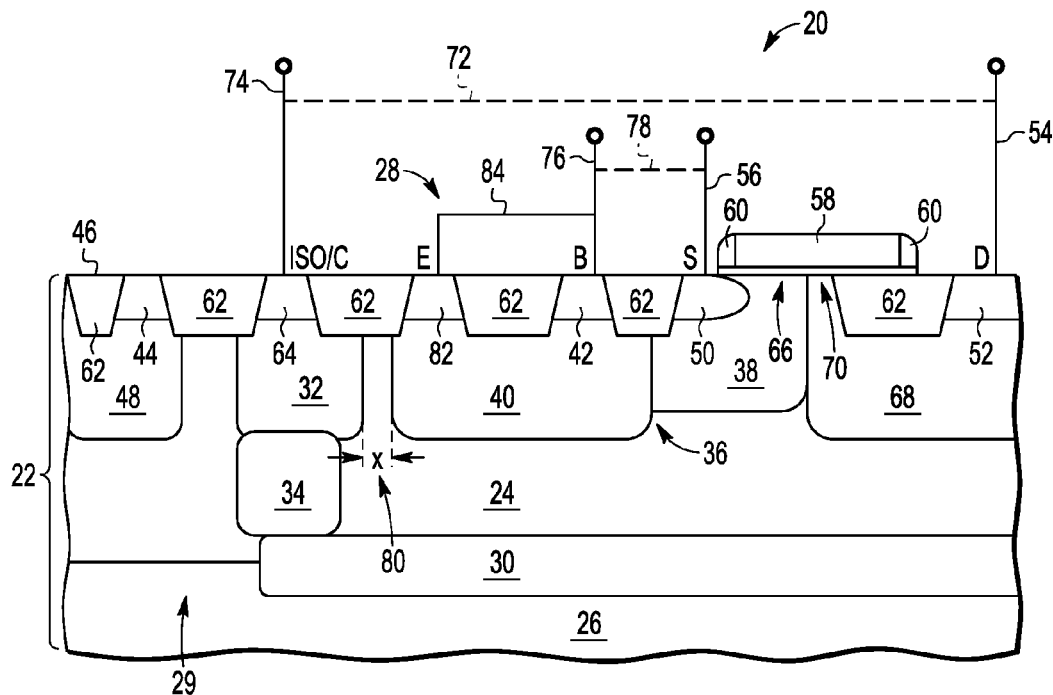
FIG. 1 is a cross-sectional, schematic, partial view of an exemplary n-channel LDMOS transistor device with an integrated bipolar transistor electrostatic discharge (ESD) clamp in accordance with one embodiment.

Embodiments of power transistor and other semiconductor devices with integrated bipolar transistor-based ESD protection, electronic apparatus including such devices, and methods of fabricating such devices, are described. The ESD protection may be provided by one or more integrated ESD clamps. Each integrated ESD clamp may include a bipolar transistor having a breakdown trigger voltage configured to protect a channel or other conduction region or path of the semiconductor device in which the ESD clamp is integrated. The terminals of the integrated ESD clamps may be electrically tied to one or more terminals of the semiconductor device to shunt the energy of the ESD event away from the channel or other region along the conduction path of the semiconductor device. A junction of the ESD clamp is configured to breakdown at a voltage level lower than a breakdown voltage of the semiconductor device along the conduction path.

ESD protection may be provided by relocating the site of the breakdown event (and current associated therewith) rather than by trying to prevent breakdown from occurring altogether. The integrated ESD clamp is integrated within the semiconductor device at a location such that the ESD clamp breaks down at a site spaced from the conduction path. As described below in connection with several examples, the ESD clamp is not disposed near the conduction path of the semiconductor device. The ESD clamp is instead integrated with a doped isolating region or area of the semiconductor device. Breakdowns occurring as a result of ESD events are thus non-destructive to normal device operation, as described below.

The position of the doped isolating region and, thus, the collector region may vary. In some cases, the doped isolating region is disposed such that ESD protection is provided via a breakdown spaced from the surface of the semiconductor substrate. For example, the doped isolating region may be a region that links an isolation ring or well at the surface with a buried layer extending across an active area of the device. In some cases, the link region laterally extends under the body region such that breakdown occurs vertically. With a vertically oriented breakdown, the breakdown protection may be insensitive to photolithographic misalignment. In other cases, breakdown protection is provided via a breakdown trigger junction oriented diagonally within the substrate to space the breakdown from the surface and other sensitive areas of the device without having to rely on a vertically oriented breakdown.

The integrated ESD clamp is configured as a bipolar transistor structure. A collector region of the bipolar transistor structure is integrated with an isolation region of the semiconductor device. Base and emitter regions of the bipolar transistor structure are integrated with a body region of the semiconductor device. In some cases, the base region and the body region may share a common well region. The spacing between the isolation and body regions establishes a breakdown trigger voltage level of the bipolar transistor structure. Once triggered, the bipolar transistor structure may provide significant more current capacity than, for instance, a breakdown diode and, thus, increased protection from the energy of ESD events.

The integration of the ESD clamp may significantly reduce the area devoted to ESD protection. The area savings are achieved through the integration of the collector, emitter, and base regions of the bipolar transistor structure within and along the isolation structures of the semiconductor device. The area savings resulting from the integration of the bipolar transistor ESD clamp may also include or involve shared metallization. One or more terminals of the bipolar transistor ESD clamp may be coupled to an interconnect or other metal line(s) also used by the semiconductor device under normal operation. An interconnect or other metal line(s) may be configured to electrically tie or short the source region of the semiconductor device with emitter and base regions of the bipolar transistor structure. Alternatively or additionally, an interconnect or other metal line(s) may electrically tie or short the drain region and the collector region.

The breakdown trigger voltage of the ESD clamp may be tuned or configured by adjusting the spacing between an isolation region and the device body. The spacing provides the flexibility to address a variety of device types, operating voltage ranges, and device applications. The spacing may be selected to establish a breakdown trigger voltage at a level comfortably between and spaced from the operating voltage of the device and the breakdown voltage at or near the channel region and/or drain region (BVdss).

The internal and integrated nature of the ESD clamp may allow the bipolar transistor ESD clamp to scale with the size of the semiconductor device (e.g., LDMOS transistor width). The bipolar transistor structure is not disposed in, for example, an end termination region of the semiconductor device. The size or area of the ESD clamp may thus adjust with transistor width. Such size scaling may maintain ESD protection effectiveness for a wide range of transistor device sizes.

The integration of the ESD clamp may be achieved, in some embodiments, without adding fabrication steps to the fabrication process. In some embodiments, the ESD clamp is achieved via a modification to one or more pre-existing mask layouts. The regions and contacts of the bipolar transistor structure may be formed via well and contact implantation procedures already available in the fabrication process flow.

Although described below in connection with LDMOS transistor devices, the disclosed devices are not limited to any particular transistor configuration. For instance, application of the features of the disclosed devices is not limited to LDMOS or other power MOS devices. One or more features of the disclosed devices may be applied to non-power MOSFET device configurations. The integrated ESD clamp of the disclosed devices may be useful in a wide variety of power electronic devices. The LDMOS transistor devices are also not limited to any one particular type of LDMOS configuration. For instance, the disclosed devices may have drift regions with various types of reduced surface field (RESURF) arrangements, including single, double, or other RESURF structural arrangements.

For convenience of description and without any intended limitation, n-channel devices are described and illustrated herein. The disclosed devices are not limited to n-channel MOSFET devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic, cross-sectional view of an example of an n-channel LDMOS device 20 constructed in accordance with one embodiment. The device 20 includes a semiconductor substrate 22, which may, in turn, include a number of epitaxial layers 24. In this example, the semiconductor substrate 22 includes a single p-type epitaxial layer 24 grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. Alternative or additional semiconductor materials may be used in other embodiments. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A portion of a device area 28 of the device 20 is depicted in FIG. 1. For some embodiments, only one side, half, or other portion of the device area 28 is shown. For example, the device area 28 may be laterally symmetrical and, thus include a portion that mirrors the portion shown. In other embodiments, the single gate portion of the device area 28 shown in FIG. 1 may be replicated any number of times (e.g., 10 or more times). The device area 28 may be defined by one or more doped isolation or isolating areas or regions in the semiconductor substrate 22 (e.g., the epitaxial layer 24). The isolation layer(s) or region(s) may laterally surround and/or define the active area 28. These layers or regions may individually or collectively act as a barrier that electrically separates the device area 28 from external portions 29 of the substrate 22 (or the original substrate 26). In some cases, multiple doped isolating layers or regions may be contiguous or coupled to one another. Thus, in embodiments having multiple doped isolating regions or layers, the doped isolating regions or layers may be considered a single doped isolating region that includes a number of constituent regions or layers. In this example, a doped buried isolating layer 30 (e.g., an N-type buried layer (NBL)) is formed or disposed in the semiconductor substrate 22. For example, the NBL 30 may be formed in the semiconductor substrate 22 before the growth of the epitaxial layer 24 thereof. The NBL 30 may extend laterally across (e.g., under) the device area 28 to act as a barrier or isolation layer separating the active area 28 from the original substrate 26.

The device 20 includes one or more further doped isolating regions surrounding the device area 28 of the device 20. The example depicted in FIG. 1 also includes a moderately or heavily doped n-type isolation well 32 that laterally surrounds the device area 28. The isolation well 32 may be ring-shaped. The isolation well 32 may be disposed on or otherwise above the NBL 30 and outside of, or along, the lateral periphery of the device area 28 as shown. The isolation well 32 may be formed in conjunction with one or more n-type wells, such as an n-type drift region described below. Alternatively or additionally, the isolation well 32 may be formed from an implantation procedure configured to form a region (e.g., a body region) of a p-type MOSFET logic device. The isolation well 32 may be connected to the NBL 30 via one or more link regions 34. In this example, the link region 34 is also configured as a ring. The isolation well 32 and the link region 34 may thus separate the device area 28 from the external portions 29 of the semiconductor substrate 22. In alternative embodiments, the isolation well 32 is configured as a sink that connects to the NBL 30 directly. One or more of the above-described isolating regions may have a dopant concentration level and/or be otherwise configured for high voltage (HV) operation (e.g., high side operation), including punch-through prevention. Any number of the isolation wells, sinks, or buried layers may be connected to one another. Additional, fewer, or alternative doped isolating layers or regions may be provided in the semiconductor substrate 22.

The device 20 includes a device body or body region 36 in the semiconductor substrate 22. In the embodiment of FIG. 1, the body region 36 is a non-uniform or composite body region. For example, the body region 36 may include multiple p-type wells formed in the epitaxial layer 24 of the substrate 22. In this embodiment, the multiple wells include an inner well 38 and an outer well 40 adjacent to the inner well 38. The outer well 40 may be disposed laterally outward of the well 38, or otherwise disposed closer to the lateral periphery of the device area 28. A source region may be disposed within, on or above the inner well 38, as described below. The inner well 38 may be configured to establish a desired threshold voltage for the device 20 and for various aspects of high voltage operation. For example, the inner well 38 may have a dopant concentration level low enough to avoid an undesirably low drain-to-body breakdown voltage level, and/or to avoid hot carrier generation. The outer well 34 may have a higher dopant concentration level than the inner well 32 to establish a low impedance connection to one or more body contact regions 42. The body region 36 is biased via the body contact region(s) 42 formed in or above the outer well 40 of the body region 36. The p-type dopant concentration of the body contact region 42 may be at a level sufficient to establish an ohmic contact with backend metallization. The body region 36 may include additional, fewer, or alternative wells or regions. For example, the body region 36 may be configured as a uniform well rather than a pair of wells, as described below in connection with the embodiment of FIG. 3.

The semiconductor substrate 22 may include one or more substrate contact regions or ties 44 for grounding or otherwise biasing the external portions 29 of the semiconductor substrate 22, such as the original substrate 26. The substrate contact region(s) 44 may be disposed at a surface 46 of the semiconductor substrate 22 outside of the device area 28. The substrate contact region(s) 44 may have a p-type dopant concentration level sufficient to form an ohmic contact with backend metallization at the surface 46. The substrate contact region(s) 44 may thus be configured similarly to the body contact region 42. In this example, the substrate contact region(s) 44 may be disposed within a well 48 formed within the epitaxial layer 24. In some cases, the well 48 is configured similarly to the outer well 40 of the body region 36. The doping, configuration, and other characteristics of the external portions 29 of the semiconductor substrate 22 may vary from the example shown. For example, the well 48 may be configured similarly to the inner well 38 or another p-type region.

In one example, a low voltage p-type well implantation procedure is implemented to form the outer well 40 and the well 48. The implantation procedure may already be implemented in connection with the formation of a p-type region of a logic device (e.g., CMOS) formed in the semiconductor substrate 22 and/or in connection with the formation of one or more p-type wells in the semiconductor substrate 22 outside of the device area 28. The wells 40, 48 may accordingly have a common depth and profile. For ease in illustration, the well 48 is intended to alternatively or additionally be schematically indicative of the p-type region of the logic transistor or other device (e.g., CMOS device) also formed in the semiconductor substrate 22. The logic device and the device 20 may form parts of one or more electronic circuits having any number of logic and power devices arranged in an electronic apparatus.

The device 20 includes heavily doped source and drain regions 50 and 52 in the semiconductor substrate 22. Any number of source or drain regions 50, 52 may be provided. In this example, the source and drain regions 50 and 52 are heavily doped n-type portions of the epitaxial layer 24. The regions 50, 52, or a portion thereof, may have a dopant concentration at a level sufficient to establish ohmic contacts for biasing the source region 50 and the drain region 52. The source region 50 is disposed within the body region 36. In this example, the source region 50 is disposed on or within the inner well 38. The drain region 52 is spaced from the source region 50 (and the body region 36) to define a conduction path of the device between the source and drain regions 50, 52. The conduction path is oriented along the lateral direction shown in FIG. 1. Further details regarding the conduction path are set forth below. In a typical LDMOS configuration, the drain region 52 is biased via an electrode or terminal 54 at a high voltage, Vds, relative to an electrode or terminal 56 electrically coupled to the source region 50. In some cases, the source region 50 may be considered to be at ground potential.

In some embodiments, the source and drain regions 50 and 52 may have additional or alternative lateral spacing. Any number of source or drain regions 50, 52 may be provided. In some embodiments, the drain region 52 is centered or otherwise disposed between, or laterally surrounded by, the source region(s) 50.

The semiconductor device 20 includes one or more gate structures 58 formed on or above the surface 46 and supported by the semiconductor substrate 22. The gate structure 58 is disposed between the source region 50 and the drain region 52. In some embodiments, the gate structure 58 surrounds the drain region 52, which may be centrally or internally disposed within the device area 28. Alternatively, the gate structure 58 may be arranged in a dual gate finger configuration in which two transistors are symmetrically arranged to share the same drain region 52. Other multiple gate finger embodiments having any number of gate fingers are possible, including embodiments in which body contacts are shared by adjacent fingers. Each gate structure 58 includes a gate dielectric layer on the surface 46. For example, the gate dielectric may include silicon dioxide (or oxide) deposited or otherwise formed on the surface 46. Each gate structure 58 includes a conductive gate layer (e.g., a polysilicon plate) on or above the gate dielectric layer, which insulates the conductive gate layer from the substrate 22. Each gate structure 58 may include one or more dielectric sidewall spacers 60 disposed along lateral edges of the gate structure 58. The sidewall spacers 60 may cover the lateral edges to act as a silicide blocker to prevent a silicide short along the surface 46. The sidewall spacers 60 may provide spacing to separate the conductive components of the gate structure 58 from the source region 50 and other regions of the active region 28. In this example, one of the sidewall spacers 60 is used for alignment purposes in defining an edge of the source region 50.

The configuration of the gate structure 58 may vary. For example, the configuration of the gate structure 58 may include multiple conductive layers (e.g., polysilicon plates). Other characteristics, such as the components, materials, and shape, of the gate structure 58 may vary from the example shown.

A number of shallow trench isolation (STI) regions 62 may be formed at the surface 46 in the semiconductor substrate 22 to electrically separate various regions from one another. For example, in this embodiment, one of the STI regions 62 is disposed between the body contact region 42 and the source region 50. Another one of the STI regions 62 is disposed under the gate structure 58 to protect the gate structure 58 from the high voltage applied to the drain region 52 and may thus prevent or minimize hot carrier injection (HCI) into the oxide layer of the gate structure 58. Yet another one of the STI regions 62 is disposed between the substrate contact region 44 and an isolation contact region 64. In this example, the isolation contact region 64 is formed within or on the isolation well 32, highly doped (e.g., n-type) to establish an ohmic contact at the surface 46, and otherwise configured to bias the doped isolating regions and/or layers. Further STI regions 62 may be disposed in the semiconductor substrate 22 to isolate or separate various other contact regions, such as contact regions configured to provide ESD protection for the semiconductor device 20, as described below.

The device 20 may include one or more lightly or intermediately doped transition or source/drain extension regions (e.g., n-type lightly doped drain, or NLDD, regions) at or near the source and drain regions 50 and 52. In the embodiment of FIG. 1, the source and drain regions 50, 52 may have respective NLDD regions adjacent the heavily doped portions thereof. Each source/drain extension region may be or include a diffused region formed in connection with the source region 50 and/or the drain region 52. The diffused region of the source region 50 may extend under the gate structure 58. The source/drain extension regions may assist in controlling the electric field at or near the surface 46, including in areas other than those areas near the source region 50 or the drain region 52.

When the gate structure 58 is biased, charge carriers (in this case, electrons; alternatively, holes) accumulate in one or more channel areas or regions 66. Each channel region 66 (or a portion thereof) may be formed during operation in the body region 36 under the gate structure 58. In this example, the channel region 66 is formed in the inner well 32. In n-channel embodiments, the accumulation of electrons results in charge inversion in the channel region 66 from the p-type inner well 32 to an n-type conduction layer or area (or other n-channel) near the surface 46 of the semiconductor substrate 22. Once a sufficient amount of the charge carriers accumulate in the conduction layer or area, charge carriers are capable of flowing from the source region 50 toward the drain region 52 through the channel region 66.

The channel region 66 may include other regions or areas in the semiconductor substrate 22 in which charge inversion or accumulation occurs as a result of the bias applied to the gate structure 58. Charge carriers may also accumulate outside of or beyond the body region 36. For example, charge carriers may accumulate in a region of the epitaxial layer 24 adjacent the body region 36. This area and the channel region 66 may form part of the conduction region or path of the device 20.

The conduction path of the device 20 is not limited to regions in which charge inversion occurs or to regions in which conduction is enabled or enhanced via the bias voltage applied to the gate structure 58. The conduction path or regions of the device 20 are thus not limited to regions at or near the surface 46 or regions having the same conductivity type as the body region 36. For example, the conduction path includes a portion of a drift region 68 through which charge carriers drift to reach the drain region 52. In this example, the drift region 68 corresponds with a portion of an n-type well under one of the STI regions 62. The location of the STI region 62 may thus define a further portion of the conduction path or region(s) of the device 20 between the source and drain regions 50, 52. This portion of the conduction path of the device 20 is within the drift region 68, outside of the channel region 66. The disclosed devices are configured to prevent or avoid breakdown occurring as a result of ESD events along these and other portions of the conduction path as described below.

The n-type well of the drift region 68 may laterally extend under the gate structure 58 to form an accumulation region 70 of the device 20. The accumulation region 70 may be disposed along the surface 46 rather than under the STI region 62. During operation, charge carriers accumulate in the accumulation region 70 before drifting through the drift region 68.

In the embodiment of FIG. 1, the drift region 68 is configured as a field drift region. The STI region 62 is disposed between the accumulation region 70 and the drain region 52. Alternative or additional field isolation structures may be disposed between the accumulation region 70 and the drain region 52. The field isolation structures may include one or more field plates disposed above the surface 46. The device 20 need not include the STI region 62 along the drift region 68, and may thus be configured as an active drift device in alternative embodiments.

The primary conduction path or regions of the device 20 may include still other regions, whether n-type or p-type, at or near the surface 46. For example, the channel region 66, the drain region 52, and/or other conduction region of the device 20 may include one or more additional LDD, transition, or source/drain extension regions (e.g., in addition to the NLDD regions described above) in the semiconductor substrate 22.

The path along which the charge carriers flow from the source region 50 to the drain region 52 passes through the drift region 68 in the semiconductor substrate 22. The drift region 68 may be configured to allow the charge carriers to drift under the electric field established by the drain-source voltage applied between the drain region 52 and the source region 50. The drift region 68 (or one or more portions thereof) thus forms part of the conduction path of the device 20. During operation, the drift region 68 electrically couples the drain region 52 to the channel region 66 and the source region 50.

During operation in some cases, the drain region 52 is electrically tied or coupled to the doped isolating region(s) or layer(s). As schematically shown as a dashed line in FIG. 1, an interconnect 72 or other metal line(s) may couple the drain electrode 54 to an isolation electrode or terminal 74 for the isolation contact region 64. The interconnect 72 may include any number of metal layers or various metallization structures. The drain bias voltage is thus applied to the doped isolating region(s) of the device 20, such as the isolation well 32, via the isolation contact region 64. In this example, the isolation well 32 is connected to the NBL 30 via the link region 34, such that the NBL 30 and the link region 34 are also biased at the drain operational voltage. The doped isolating regions may thus be biased relative to the semiconductor substrate 22 via the drain operational voltage and the voltage applied to the semiconductor substrate at the substrate contact region 44. In alternative embodiments, the drain region 52 is not tied to the doped isolating regions. The doped isolating regions may be biased at a different voltage level via the electrode 74.

The biasing of the doped isolating regions may define one or more reverse-biased junctions along an interface 80 between the doped isolating regions and the body region 36. The body region 36 may be biased via an electrode or terminal 76 and the body contact region 42. In some cases, the body region 36 is biased at the same potential as the source region 50. An interconnect 78 or other metal line(s) may be used to electrically couple the electrode 76 to the electrode 56 for the source region 50. In other cases, the body region 36 is biased at a lower voltage (e.g., ground) than the source region 50.

The interface 80 and/or the regions defining the interface 80 are configured such that the junction(s) along the interface 80 experiences breakdown before breakdown along the above-described conduction path regions of the device 20. The breakdown voltage of the junction(s) at the interface 80 (e.g., an extrinsic breakdown voltage level) is thus set to a level lower than the breakdown voltage of the device 20 in the conduction path (an intrinsic breakdown voltage of, e.g., 95 Volts). The extrinsic breakdown voltage level is also higher than the drain-source operational voltage (e.g., 80 Volts), such that breakdown does not occur during normal operation (e.g., in embodiments having the doped isolating regions and the drain region 52 electrically connected). The doped isolating region(s) and the body region 36 are spaced from one another by a spacing X to establish the extrinsic breakdown voltage level lower than the intrinsic breakdown voltage level, as described below.

The semiconductor device 20 is configured with an integrated bipolar transistor ESD clamp configured to shunt ESD energy away from the conduction path. Conduction of the ESD energy via the bipolar transistor ESD clamp is triggered once the voltage across the interface 80 reaches the extrinsic breakdown voltage level. The spacing X and/or other characteristics of the interface 80 may establish or define a breakdown trigger voltage level of the integrated bipolar transistor ESD clamp of the device 20.

In the embodiment of FIG. 1, the bipolar transistor ESD clamp is integrated with the semiconductor device 20 as follows. In this example, the bipolar transistor is configured as an npn bipolar transistor. The isolation contact region 64 is coupled to (e.g., included within) one or more of the doped isolating regions to define or provide a collector region of the bipolar transistor. In this example, the collector region includes the isolation well 32. The collector region may include other regions or portions of the isolation ring in alternative embodiments.

The body region 36 provides the base region of the bipolar transistor ESD clamp. The body contact region 42 may thus act as a base contact region for the bipolar transistor ESD clamp. Another contact region 82 is disposed within or on the body region 36 and is configured to act as an emitter region of the bipolar transistor ESD clamp. In this example, the emitter region 82 includes a heavily doped n-type contact region disposed within or on the outer well 40. The location of the emitter region 82 within the body region 36 may vary from the example shown. For example, the spacing between the emitter region 82 and the body contact region 42 may vary.

In the embodiment of FIG. 1, the isolation well 32 and the outer well 40 are spaced apart from one another to establish the breakdown trigger voltage level of the bipolar transistor ESD clamp. The spacing is indicated in FIG. 1 by the lateral distance X. The spacing may fall in a range from about 0 µm to about 4 µm, although other distances may be used. The spacing may depend upon a number of factors in addition to the desired breakdown trigger voltage level, including the dopant concentration levels of the inner well 32, the outer well 40, and the epitaxial layer 24 in the gap at the interface 80. The spacing may vary to establish a breakdown trigger voltage level above an expected range of operating voltages of the semiconductor device 20 (e.g., a drain-source bias voltage) but below a breakdown voltage level of the semiconductor device 20 along the conduction path. For example, the breakdown trigger voltage level of the bipolar transistor may be lower than the off-state breakdown voltage level BVdss of the semiconductor device 20. In one example, the spacing between the outer well 40 and the isolation well 32 is about 2 µm. The spacing may vary based on, for instance, one or more of the dopant concentration levels of the outer well 40, the isolation well 32, and the epitaxial layer 24.

The dopant concentration levels and other characteristics of the regions defining the interface 80 may be used to tune the breakdown trigger voltage level. For example, the dopant concentration level of the outer well 40 may be higher than other portions of the body region 36, such as the inner well 38. The dopant concentration of the outer well 40 may be selected to achieve a desired breakdown trigger voltage level. In addition or alternative to a dopant concentration level adjustment, the shape, size, and/or position of the body region 36 and/or isolation region(s) may be adjusted to achieve a desired breakdown trigger voltage level. For instance, the outer well 40 and/or the isolation well 32 may have a lower boundary at a depth that modifies the interface 80. In one example, the lower boundary of the outer well 40 is deeper than the lower boundary of the isolation well 32 such that the interface 80 is defined, at least in part, by the spacing between the link region 34 and the outer well 40. Alternatively or additionally, the link region 34 may laterally extend beyond the isolation well 32 (e.g., inward toward the outer well 40) to define the interface 80 as well as a spacing Y as shown and described in connection with the embodiment of FIG. 4.

The positioning of the interface 80 may ensure that breakdown from an ESD event is sufficiently spaced from the conduction path of the semiconductor device 20. The outer well 40 and the isolation well 32 are spaced from the source region 50 and the channel region 66 by the remainder of the body region 36 (e.g., the inner well 38). The separation or spacing is sufficient to avoid damage to the conduction regions in the event of breakdown at the interface 80. With the breakdown occurring along the outer periphery of the device area 28, the energy of an ESD event does not damage the channel region 66 or other regions along the conduction path.

The semiconductor device 20 is depicted in FIG. 1 in a configuration in which the semiconductor device 20 may be exposed to the ESD energy via the isolation terminal 74 and/or the drain terminal 54. Once the ESD energy applied at the isolation terminal 74 is sufficient to cause breakdown at the interface 80, charge carriers from the breakdown can activate the bipolar transistor.

With an interconnect 84 coupling the emitter region 82 to the body terminal 76, the potential at the emitter contact and at the base contact are always equal and typically at ground. When a significant amount of current flows from the collector contact to the base contact, as in the case of a breakdown at the collector/base junction (e.g., the interface 80), the current will give rise to a drop in potential across the base region (e.g., body region 36) due to the series resistance of the base region. For example, with the base contact at ground and the collector at a higher voltage such as 45V, the potential directly under the emitter region 82 will be greater than zero due to the current-resistance (IR) drop from the location under the emitter region 82 to the location under the base contact 42. When this positive potential is sufficiently high, the emitter/base junction is forward biased because the emitter is always at ground as a result of the interconnect 84. When this forward bias condition is established, the npn bipolar transistor is turned on and a large amount of current flows from the collector to the emitter and, thus, to ground through the interconnect 84. The interconnect 84 may include one or more metal or other conductive layers, which may be connected to the body terminal 76. The emitter region 82 may be coupled to the body contact region 42 via any metal or other conductive structure.

The semiconductor device 20 is shown in simplified form and, thus, FIG. 1 does not show all of the conductive (e.g., ohmic) contacts and other metal layers configured for electric coupling with the source regions 50, the drain regions 52, and the gate structures 58. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be configured as a p-type buried layer. One or more deep isolation trenches and/or other isolation structures (not shown) may be provided to isolate the device area 28 and/or other region of the device 20.

The semiconductor device 20 may include any number of ESD clamps. In some cases, the ESD structures described above form a single bipolar transistor disposed along a periphery of the device area 28. In other cases, multiple bipolar transistors are formed along the periphery.

Figure 2:
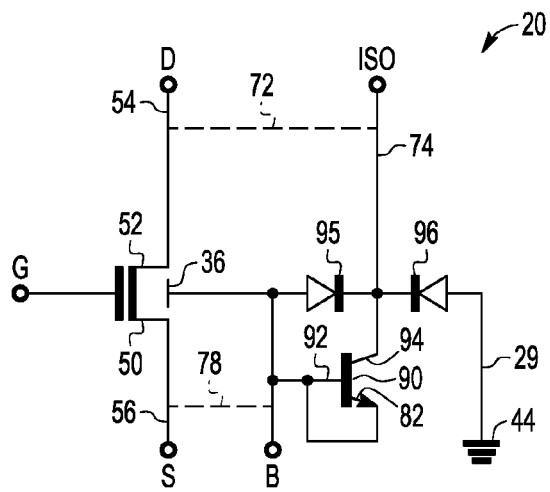
FIG. 2 is a circuit diagram of the n-channel LDMOS transistor device of FIG. 1.

FIG. 2 depicts an equivalent circuit of the semiconductor device 20 to show the integration of the bipolar transistor, which is schematically indicated at 90. A base 92 of the bipolar transistor 90 corresponds with, and/or is electrically connected to, the body region 36. The body region 36 is also electrically connected to the emitter region 82 (via, e.g., the interconnect 84). A collector 94 of the bipolar transistor 90 corresponds with, and/or is electrically connected to, the isolation terminal 74 (and the isolation contact region 64 as shown in FIG. 1).

An isolation-to-body diode 95 represents the junction between the body region 36 (and the base 92) and the NBL 30 (FIG. 1). The diode 95 has a higher breakdown voltage level than the breakdown trigger voltage level of the bipolar transistor 90 associated with breakdown at the interface 80 (FIG. 1). Another diode or junction 96 is also present between the isolation/collector node and the external portion 29 of the substrate 22 biased via the substrate contact 44. The junction 96 may be disposed along the NBL 30 (FIG. 1) and/or laterally along the isolation well 32, the link region 34, or other region of the isolation ring.

In some cases, the body region 36 and the base 92 may also be electrically connected to the source terminal 56 and the source region 50 via, e.g., the interconnect 78. Alternatively or additionally, the isolation terminal 74 may be electrically connected to the drain terminal 54 and the drain region 52 via, e.g., the interconnect 72. Other connections may be used. For example, the isolation terminal 74 and the drain terminal 54 may instead be coupled by a resistor, a Schottky diode, or a series or parallel combination thereof. The Schottky diode may be configured and disposed in a reverse-biased arrangement to establish a desired voltage level at one of the drain terminal 54 or the isolation terminal 74 relative to the other. Alternatively, the Schottky diode is disposed in a forward-biased condition during normal operation to suppress substrate current when one or more nodes (e.g., the source/body node) go negative, a condition that pulls the drain and isolation ring negative to create the forward biased condition.

Figure 3:
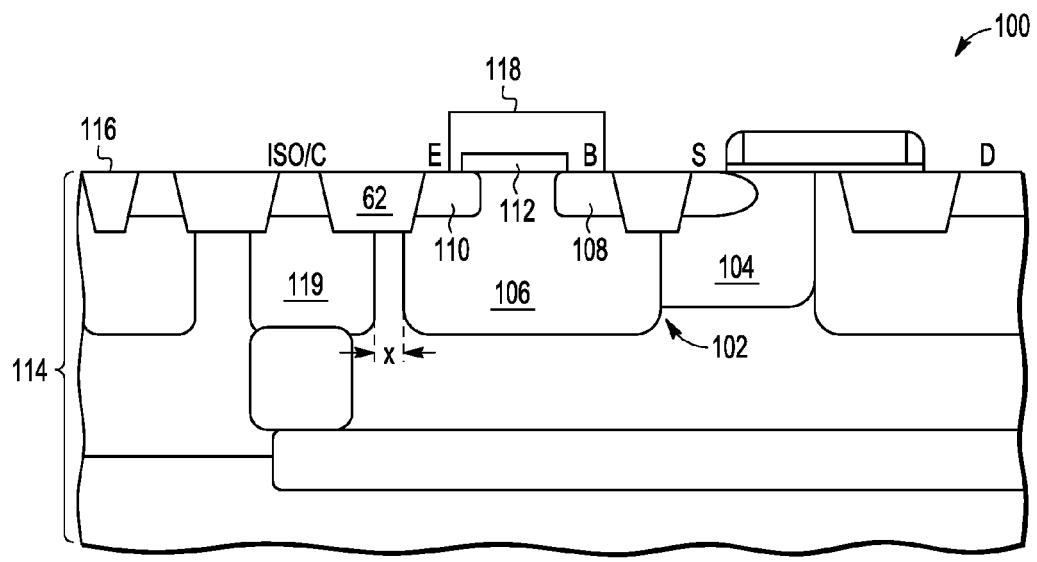
FIG. 3 is a cross-sectional, schematic, partial view of another exemplary n-channel LDMOS transistor device with an integrated bipolar transistor ESD clamp in accordance with one embodiment.
Figure 4:
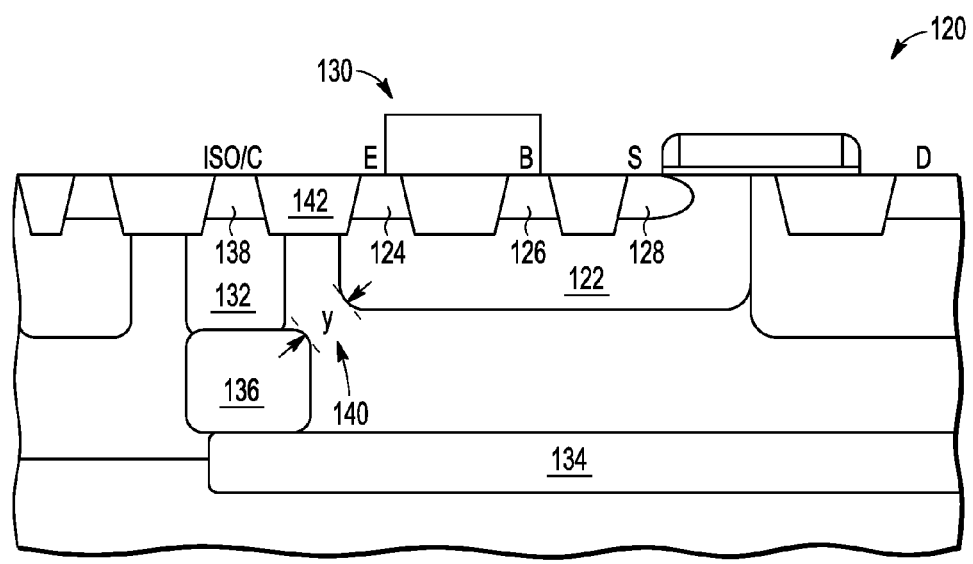
FIG. 4 is a cross-sectional, schematic, partial view of yet another exemplary n-channel LDMOS transistor device with an integrated bipolar transistor ESD clamp in accordance with one embodiment.

FIGS. 3 and 4 depict alternative embodiments of the disclosed devices, each having an integrated bipolar transistor ESD clamp. In each embodiment, one or more regions along a lateral periphery of the device are configured to establish a breakdown trigger voltage level to active the ESD clamp and protect the conduction path of the device, as described above. In some embodiments, and as described above, the configuration of such region(s) may be achieved via pre-existing steps or procedures (e.g., a dopant implant) in a fabrication process. The ESD protection achieved by the disclosed devices, in some embodiments, may thus be provided under a variety of fabrication processes (or process technologies) without requiring any additional implants or other procedures.

FIG. 3 depicts a semiconductor device 100 having an integrated bipolar transistor ESD clamp. The semiconductor device 100 may be configured similarly to the above-described embodiments in a number of ways. For example, the regions along the conduction path of semiconductor device 100 may be configured similarly to those described above (e.g., the source, channel, accumulation, drift, and drain regions). As with the above-described embodiments, the semiconductor device 100 includes a non-uniform or composite body region 102 having an inner well 104 and an outer well 106. A body contact region 108 and an emitter contact region 110 are disposed within or on the outer well 106. The body contact region 108 may also be laterally spaced from the emitter contact region 110 to a similar extent. However, in this embodiment, an STI region is not disposed between the body contact region 108 and the emitter contact region 110. The contact regions 108, 110 are instead separated by a silicide blocker 112 supported by a semiconductor substrate 114 in which the semiconductor device 100 is formed. The silicide blocker 112 may be disposed along a surface 116 of the semiconductor substrate 114. A portion of the body region 102 (e.g., the outer well 106) may thus be disposed between the contact regions 108, 110. The contact regions 108, 110 may still be electrically connected via, e.g., an interconnect 118 or other metal or conductive link.

The silicide blocker 112 may be used to establish a spacing between the contact regions 108, 110. For example, the silicide blocker 112 may be deposited on the surface 116 before the implementation of respective dopant implantation procedures used to form the contact regions 108, 110. The silicide blocker 112 may establish a desired amount of series resistance in the base region such that the emitter/base junction is forward biased when breakdown occurs. Without the silicide blocker 112, if silicide forms at the surface, current may flow through the silicide at the surface to the base contact without creating enough voltage drop in the silicon to turn on the npn bipolar transistor. The silicide blocker 112 may additionally serve as a mask or alignment aid in forming the contact regions 108, 110.

While the above-described STI region may be similarly useful for establishing the spacing, the silicide blocker 112 may also be useful for establishing a charge carrier path length within the body region 106. The absence of the STI region means that the charge carriers need not flow under or around the STI region to reach the body contact region 108. The silicide blocker may thus allow the charge carrier path length to be further adjusted (e.g., shortened).

Adjusting the path length may allow the operational characteristics (e.g., current capacity, gain, and/or efficiency) of the ESD clamp to be tuned, adjusted, or optimized. For example, with a shorter path length, the voltage drop across the outer well 106 (e.g., base) is lowered. The resistance presented by the path may thus be lowered, which may increase the current capacity of the bipolar transistor.

The adjustments to the path length within the body region 102 may provide design flexibility. For example, the adjustments may optimize the operation of the ESD clamp to provide sufficient ESD protection without involving changes to the dopant concentration levels and/or other characteristics of the body region 102 or a doped isolating region, such as an isolation well 119 that acts as a collector of the ESD clamp as described above. In an alternative embodiment, the lateral width and/or depth of an STI region between the base and emitter regions is adjusted.

FIG. 4 depicts a semiconductor device 120 having an integrated bipolar transistor ESD clamp. The semiconductor device 120 may have a number of structures, components, regions, and other characteristics in common with the embodiments of FIG. 1 and/or FIG. 3. In contrast to the above-described embodiments, the semiconductor device 120 has a uniform body region 122. In this example, the body region 122 includes a single well. The well 122 may have a uniform dopant concentration profile across its lateral width. An emitter contact region 124, a body (base) contact region 126, and a source region 128 are disposed within or on the well. The well 122 may be configured similarly to the wells (e.g., the inner wells) in which the channel is formed during operation, as described above. For example, the dopant concentration of the well 122 may be at a level appropriate for high voltage operation.

The semiconductor device 120 also differs from the above-described embodiments in the configuration of a doped isolating region(s) defining a lateral periphery of a device area 130 of the semiconductor device 120. As with the above-described embodiments, the doped isolating region includes an isolation well 132, an NBL 134 extending across the device area 130, and a link region 136 coupling the isolation well 132 and the NBL 134. Also as described above, an isolation contact region 138 is disposed within or on the isolation well 132 for biasing the doped isolating regions and layers. The isolation well 132 and the link region 136 act as the collector of the bipolar transistor in this embodiment. The link region 136 extends laterally inward beyond an inner boundary of the isolation well 132 and toward the body region 122 to define a spacing Y at an interface 140 between the body region 122 and the link region 136. The spacing establishes the breakdown trigger voltage level of the ESD clamp. Use of the link region 136 may provide an opportunity to use a different dopant concentration level than the level presented by the isolation well 132. For example, the link region 136 may have an n-type dopant concentration level appropriate for the dopant concentration level of the body region 122.

The use of the link region 136 may also change the orientation of the interface 140. In the example shown in FIG. 4, the breakdown may occur along a diagonal direction corresponding with the shortest distance between the body region 122 and the link region 136. The interface 140 may thus have a diagonal orientation instead of the vertical orientation of the embodiments of FIGS. 1 and 3. The diagonal orientation may result in breakdown that occurs at a safe depth in the substrate, e.g., farther away from an STI region 142, thus reducing possibility of charge trapping at the bottom of the STI. The diagonal orientation may thus result in more consistent and repeatable breakdown by avoiding trapped charges in the STI region 142 that can change the breakdown voltage and/or off state leakage. The diagonal orientation of the interface 140 may also be useful for establishing a longer distance for the spacing Y while still maintaining a minimum amount of lateral spacing between the doped isolating regions and the body region 122. Device area may thus be minimized despite an interest in a larger spacing for a higher breakdown trigger voltage level.

The extent to which the link region 136 (or any of the other link regions described herein) extends laterally inward may vary from the example shown. For example, the link region 136 may extend laterally to an extent that the link region 136 laterally overlaps with the body region 122. In that case, the interface is horizontally oriented and the spacing is established by the difference between the depths of a lower boundary of the body region 122 and an upper boundary of the link region 136. As a result, the location of the interface is not subject to problems arising from a photolithographic misalignment of the various implantation procedures used to form the regions.

Each of the above-described bipolar transistor ESD clamps may scale with device width or size. The size of the above-described semiconductor devices may vary in the lateral direction perpendicular to the one shown in the cross-sections of the drawing figures. Any change in that lateral width of the power MOSFET device, however, also results in a corresponding or matching change in the lateral width of the bipolar transistor ESD clamp. As a result, the current capacity of the bipolar transistor ESD clamps described herein can adjust with the size of the power MOSFET device. Such scaling may not, however, apply to the other lateral dimension of the device. Thus, in some embodiments for example, the ESD clamps described herein may not scale with increases in device width arising from a multiple gate finger arrangement (e.g., more than two gate fingers). The number of gate fingers (e.g., 10 or less) may be selected to ensure that adequate ESD protection is provided. On the other hand, a higher number of gate fingers may be more area efficient because only one isolation ring and substrate tie is used for all of the gate fingers of the device. One possible solution to mitigate the area penalty with the isolation ring while still providing sufficient ESD protection is to have adjacent devices share an isolation ring or region. For example, for a four gate finger device, two double-finger devices may be disposed side by side to share the region(s) of the isolation ring between the devices. The footprint is still larger than a four finger device footprint because of the isolation region in between the devices. However, the footprint is still smaller than the footprint of two double finger devices not sharing the isolation ring. In the latter case, two isolation rings, at least one substrate tie, and two isolation ring to substrate tie spacings between the two devices.

The use of the isolation rings and other peripheral isolation regions to integrate the ESD protection may result in significant size savings. The bipolar transistor ESD clamps described herein provide the advantages and benefits of a bipolar transistor ESD clamp while providing isolation for both the ESD clamp and the power MOSFET device. An isolation ring and isolation contact (e.g., tie) of an LDMOS transistor device may occupy a considerable amount of area. A similar isolation ring and contact arrangement is typically used to isolate an ESD clamp. By using the same isolation ring and contact regions for both the device and the ESD clamp, a significant area penalty may be avoided. The resulting area savings may more than offset the increase in width resulting from an extra contact or pickup in the device body for the emitter of the bipolar transistor.

Further area savings may be realized due to the sharing of metallization between the ESD clamp and the power MOSFET device. The metal interconnects and routing for a power MOSFET are often very large to accommodate high current levels. ESD clamps also often have large interconnects and routing for the same reason. Using the same metallization for both the power MOSFET and the ESD clamp may result in significantly less area consumption.

The integrated ESD clamps described herein may be used to provide a secondary layer of ESD protection for a power MOSFET or other transistor device. An integrated circuit or electronic apparatus in which the device is incorporated may have a number of primary ESD protection devices connected between input/output (I/O) pins and ground. The integrated ESD clamps may provide additional protection in the event that some of the ESD energy passes through the primary ESD protection devices protecting the entire circuit or apparatus. Alternatively or additionally, the integrated ESD clamps may be used in a primary ESD protection capacity.

Testing of an exemplary power transistor device (e.g., an n-type channel LDMOS transistor device) configured with an integrated ESD clamp as described above shows that device performance does not degrade after numerous ESD events. The test data shows that adding the integrated ESD clamp does not change the off-state or on-state operational characteristics of the LDMOS transistor device, such as the threshold voltage (Vt), the drain-source resistance (Rdson), or other aspects of the current-voltage, or Id-Vd, characteristic of the LDMOS transistor device. The test data shows that these characteristics of the LDMOS transistor device remain unaffected after repeated breakdown of at the collector-base interface. The breakdown at the collector-base interface is thus non-destructive and repeatable. The data shows no shift or degradation in the characteristics of the LDMOS transistor device after multiple ESD events.

These results may be achieved in a manner transparent to design and modeling. No additional fabrication process steps or procedures are involved. In this example, the modification to the fabrication process involves a source/drain implant mask change to form the emitter contact region within the body region. Other mask implants with mask modifications may be directed to forming one or more p-type regions of other devices (e.g., logic transistor devices, such as CMOS devices).

The dopant concentrations, thicknesses, and other characteristics of the other above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| epitaxial 24: | $1 \times 10^{15}/cm^3$ | 5 μm |
| substrate 26: | $1 \times 10^{15}/cm^3$ | not applicable |
| NBL 30 | $5 \times 10^{18}/cm^3$ | 1 μm |
| isolation well 32: | $1 \times 10^{17}/cm^3$ | 1 μm |
| link region 34: | $1 \times 10^{17}/cm^3$ | 3 μm |
| inner well 38: | $1 \times 10^{16}/cm^3$ | 1.5 μm |
| outer well 40: | $1 \times 10^{17}/cm^3$ | 1.5 μm |
| contact 42: | $1 \times 10^{21}/cm^3$ | 0.25 μm |
| contact 44: | $1 \times 10^{21}/cm^3$ | 0.25 μm |
| well 48: | $1 \times 10^{21}/cm^3$ | 0.25 μm |
| source 50: | $1 \times 10^{21}/cm^3$ | 0.25 μm |
| drain 52: | $1 \times 10^{21}/cm^3$ | 0.25 μm |
| contact 64: | $1 \times 10^{21}/cm^3$ | 0.25 μm |
| drift 68: | $1 \times 10^{16}/cm^3$ | 1.5 μm |
| emitter 82: | $1 \times 10^{21}/cm^3$ | 0.25 μm |

The concentrations and thicknesses may be different in other embodiments. For example, the dopant concentration of the original substrate 26 may vary considerably.

Figure 5:
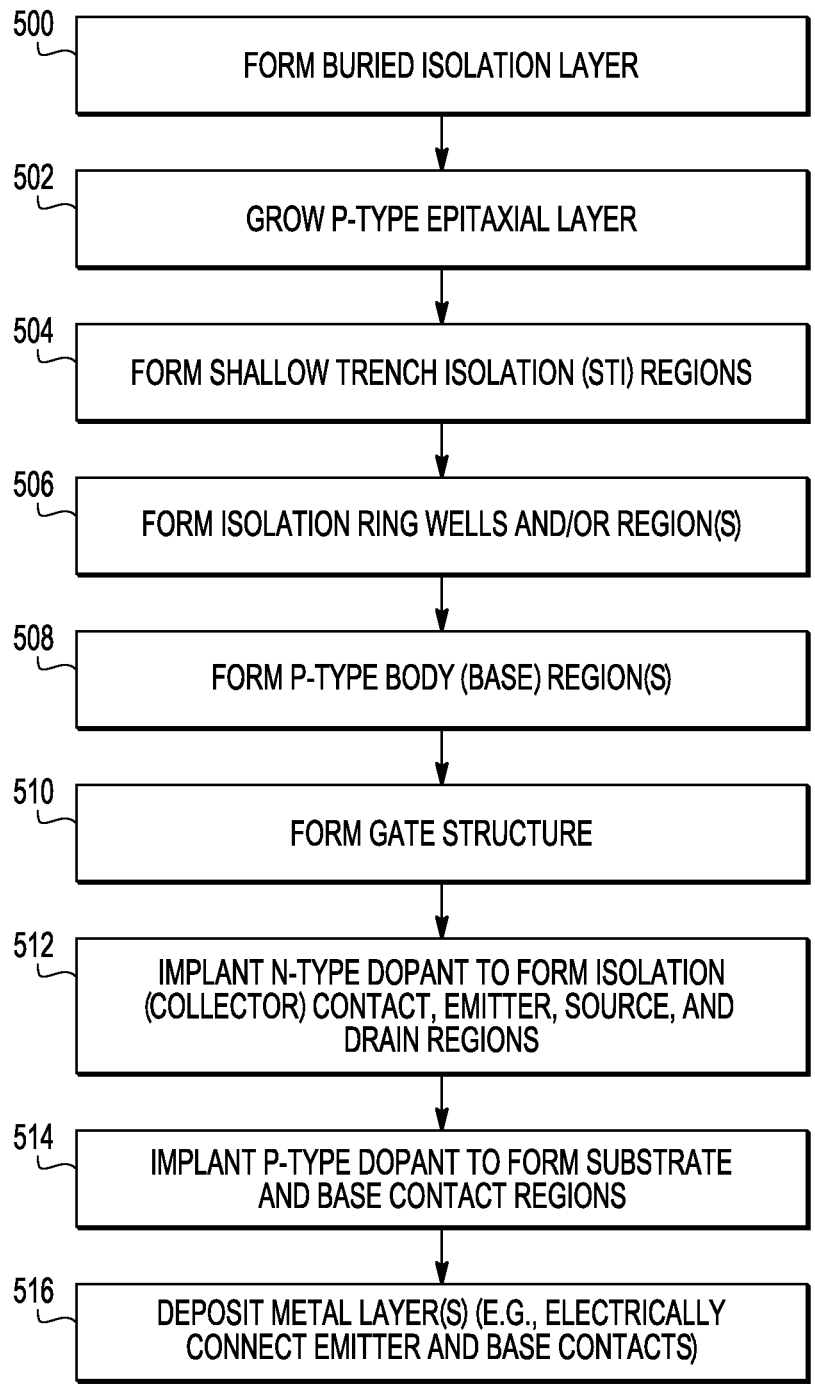
FIG. 5 is a flow diagram of an exemplary fabrication sequence to construct a semiconductor device having an integrated bipolar transistor ESD clamp in accordance with one embodiment.

FIG. 5 shows an exemplary fabrication method for fabricating a power transistor or other semiconductor device with an integrated bipolar transistor ESD clamp as described above. In this example, the power transistor device includes an LDMOS transistor device having one or more of the features described above. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, the device body may be formed before the formation of a doped isolation region(s). The fabrication method is not limited to any particular doping mechanism or procedure, and may include future developed doping techniques and procedures.

The method may begin with, or include, an act 500 in which an n-type layer is formed via, e.g., an n-type implantation procedure, in either an n-type or p-type original semiconductor substrate. An n-type or p-type epitaxial layer is then grown on the original semiconductor substrate in an act 502. With the growth of the epitaxial layer, the n-type layer is configured as a buried doped isolating layer, such as the above-described NBL 30 (FIG. 1). The buried doped isolating layer(s) may be patterned via a mask to extend across all of a device area of the semiconductor device. Any number of epitaxial layers may be grown to define the semiconductor substrate in which a number of device regions of the device are formed. As described above, the epitaxial layer is optional.

Any number of STI and deep trench isolation (DTI) regions are then grown or otherwise formed at the surface of the substrate in an act 504. The STI regions may be alternatively formed after one or more of the above-described device regions are formed in the epitaxial layer. The STI regions may be formed via any now known or hereafter developed procedure. For example, the procedure may include the formation of a trench and the deposition (e.g., chemical vapor deposition, or CVD) of one or more materials in the trench. In some embodiments, the trench is filled with silicon oxide. Additional or alternative materials may be deposited to fill the trench or implanted to damage the substrate.

In act 506, one or more n-type doped isolating regions are formed in the semiconductor substrate via one or more isolation doping procedures conducted and configured to define a device area. As in the examples described above, a ring-shaped isolation well and one or more link regions may be formed. In an alternative embodiment, the NBL layer may be formed at this time rather than in act 500. In one example, each doped isolating region is formed during a respective ion implantation procedure configured via a mask, which may also be directed to the formation of one or more n-type regions of non-power or other transistor devices disposed in the semiconductor substrate, such as a CMOS transistor device. For example, the doped isolating regions may include a deep n-type well (see, e.g., FIGS. 1, 3, and 4), the implantation mask for which may be configured to form a region of another device at a similar depth.

The act 506 may include the formation of an additional n-type region in the epitaxial layer via another implantation procedure. The additional n-type region may correspond with a drift region of the device. Alternatively, the drift region may be formed at a different point in the fabrication sequence. The drift region may alternatively be formed via one of the implantation procedures directed to forming one of the doped isolating regions.

A p-type body region may be formed via conduction of one or more body doping procedures in act 508. For example, the body doping procedure may include the implementation of an n-type implantation procedure. As described above, the body region and at least one of the device isolating regions are spaced from one another to establish an extrinsic breakdown voltage level between the doped isolating region and the body region lower than an intrinsic breakdown voltage of the device in the conduction path of the device. The extrinsic breakdown voltage level corresponds with a breakdown trigger voltage level of the bipolar transistor ESD clamp. In cases where the body region is non-uniform, the act 508 may include multiple implantation procedures. For example, the body region may be formed by implanting p-type dopant in an inner well region (within or on which a source region is later formed) and by implanting p-type dopant in an outer well region adjacent the inner well region. The outer well region may be spaced from at least one of the doped isolating regions to establish the breakdown trigger voltage level of the bipolar transistor ESD clamp. The inner and outer wells may have different dopant concentration levels. The outer well may be formed during an implantation procedure that also forms a well of a logic transistor fabricated in the semiconductor substrate. The point at which the implantation procedure(s) are implemented may vary. Either one of the implantation procedures may be additionally directed to the formation of a p-type region of another device. In some cases, the inner well implant may span the entire body region such that the outer well region is formed by a combination of the inner well and outer well implants, which may provide a greater dopant concentration level for the outer well region relative to the level provided by the outer well implant alone.

The fabrication process may include one or more procedures collectively shown in act 510 in which a gate structure is formed. The procedures may include the growth and patterning of gate oxide and polysilicon layers. After these components of the gate structure are formed, one or more source/drain transition or extension regions (e.g., NLDD regions) may be formed via, e.g., an implantation procedure. Sidewall spacers of the gate structure may then be formed via, e.g., deposition of a dielectric material.

In act 512, an n-type contact doping procedure is conducted to form a number of contact regions at the surface of the semiconductor substrate. The doping procedure is configured to form source and drain regions within or on the body and drift regions, respectively, an emitter region of bipolar transistor ESD clamp within or on the body region, and an isolation contact region for the doped isolating region(s), which define(s) a collector region of the bipolar transistor ESD clamp. One or more implantation procedures may be implemented, using the gate structure and/or STI region(s) for self-alignment for, e.g., the source region. A mask of the doping procedure is configured such that the source and drain regions are spaced from one another to define a conduction path that passes through the body region. The drain region is spaced from the body region by the drift region and other parts of the conduction path (e.g., the accumulation region).

P-type contact regions are formed in act 514 via conduction of one or more contact doping procedures. One or more p-type dopant implantation procedures may be conducted. For example, a heavily doped p-type contact region for the device body may be formed within the outer well of the body region. The p-type contact region may define or act as a body contact for the semiconductor device as well as a base contact of the bipolar transistor ESD clamp. One or more substrate contact regions may be formed outside of the device area.

In act 516, one or more metal or other conductive layers may then be deposited or otherwise formed. For instance, a metal interconnect may be deposited and patterned to short or electrically connect the emitter and base contact regions. In some cases, another metal interconnect may be deposited and patterned to short or electrically connect the drain region and the doped isolating regions. Alternatively or additionally, another metal interconnect may be deposited and patterned to short or electrically connect the source region, the emitter region, and the base contact region, to one another. Further metal interconnects and structures may be formed. The composition of the metal layer(s) may vary considerably. The manner in which the metal layer(s) are formed may also vary.

Additional acts may be implemented at various points during the fabrication procedure. For example, one or more acts may be directed to defining an active area of the device. In some cases, such acts may include the formation of a deep trench isolation region.

The above-described transistor devices are configured such that ESD and other breakdown events occur at locations other than, outside of, or otherwise spaced from, the conduction region(s) or path(s) of the device, despite the integrated nature of the bipolar transistor ESD clamps. The ESD clamps may be oriented laterally, vertically, or diagonally within the transistor device. The orientation options may provide design flexibility for utilizing preexisting fabrication procedures to form and tune the ESD clamps. The ESD clamps are engineered to have a breakdown trigger voltage level slightly below the intrinsic breakdown voltage (BVdss) of the device to ensure breakdown always occurs at the ESD clamp. As described above, the breakdown trigger voltage level of the ESD clamps may be tunable by adjusting the location, spacing, or dopant concentration levels of the regions defining the ESD clamp.

The bipolar transistor ESD clamps of the disclosed devices are established and integrated via one or more doped isolating regions of the device. The ESD clamps may thus be disposed along a lateral periphery of the device. With the ESD clamp spaced away from the normal current conduction path of the transistor device, ESD or other breakdown do not cause destruction or degradation of device performance, such as the device I-V characteristics. The integration with the doped isolating region(s) allows the size of the ESD clamp to scale with the transistor device, thereby maintaining protection effectiveness when the width of the transistor device changes. These and other advantages may be achieved in a manner transparent to design and modeling. The ESD clamps may be formed without any additional fabrication process steps, without any process modifications other than a mask layout change, and with minimum increase in device footprint or area (e.g., less increase than that presented by a combination of an LDMOS transistor device and a non-integrated bipolar transistor ESD clamp).

In a first aspect, a device includes a substrate, a body region in the substrate and having a first conductivity type, source and drain regions in the substrate, having a second conductivity type, and spaced from one another to define a conduction path that passes through the body region, a doped isolating region in the substrate, having the second conductivity type, and configured to surround a device area in which the conduction path is disposed, an isolation contact region in the substrate, having the second conductivity type, and electrically coupled to the doped isolating region to define a collector region of a bipolar transistor, and first and second contact regions within the body region, having the first and second conductivity types, respectively, and configured to define a base contact region and an emitter region of the bipolar transistor, respectively.

In a second aspect, an electronic apparatus includes a substrate and a laterally diffused metal-oxide-semiconductor (LDMOS) transistor device in the substrate. The LDMOS transistor device includes a first semiconductor region having a first conductivity type, second and third semiconductor regions having a second conductivity type and spaced from one another to define a conduction path of the LDMOS transistor device that passes through the first semiconductor region, a fourth semiconductor region having the second conductivity type and configured to surround a device area in which the conduction path is disposed, a fifth semiconductor region having the second conductivity type and electrically coupled to the fourth semiconductor region to define a collector region of a bipolar transistor, and sixth and seventh semiconductor regions within the first semiconductor region, having the first and second conductivity types, respectively, and configured to define a base contact region and an emitter region of the bipolar transistor, respectively. The fourth semiconductor region and the first semiconductor region are spaced from one another to establish a first breakdown trigger voltage level of the bipolar transistor lower than a second breakdown voltage level of the LDMOS transistor device along the conduction path.

In a third aspect, a method of fabricating an LDMOS transistor device having a bipolar transistor for ESD protection includes doping a substrate to form a body region of the LDMOS transistor device in the substrate, the body region having a first conductivity type, forming a device isolating region of the LDMOS transistor device in the substrate, the device isolating region having a second conductivity type and surrounding a device area of the LDMOS transistor device in which the body region is disposed, forming a base contact region of the bipolar transistor, the base contact region being disposed within the body region and having the first conductivity type, and doping the substrate to form an isolation contact region for the device isolating region that defines a collector region of the bipolar transistor, to form source and drain regions of the LDMOS transistor device in the substrate, and to form an emitter region of the bipolar transistor within the body region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A method of fabricating a laterally diffused metal-oxide-semiconductor (LDMOS) transistor device having a bipolar transistor for electrostatic discharge (ESD) protection, the method comprising:
   doping a substrate to form a body region of the LDMOS transistor device in the substrate, the body region having a first conductivity type;
   forming a doped isolating region of the LDMOS transistor device in the substrate to define a collector region of the bipolar transistor, the doped isolating region having a second conductivity type and surrounding a device area of the LDMOS transistor device in which the body region is disposed;
   forming a base contact region of the bipolar transistor, the base contact region being disposed within the body region and having the first conductivity type; and
   doping the substrate to form an isolation contact region for the doped isolating region, to form source and drain regions of the LDMOS transistor device in the substrate, and to form an emitter region of the bipolar transistor spaced from the source region within the body region, wherein the emitter region is spaced apart from all source regions of the LDMOS transistor device.

2. The method of claim 1, further comprising depositing a metal layer to form an interconnect configured to electrically tie the base contact region and the emitter region to one another.

3. The method of claim 1, wherein doping the substrate to form the body region comprises:
   forming a first well in which the source region is formed; and
   forming a second well adjacent the first well and in which the emitter and base contact regions are formed.

4. The method of claim 1, wherein the body region and the doped isolating region are spaced from one another by a portion of the substrate having the first conductivity type.

5. A method of fabricating a laterally diffused metal-oxide-semiconductor (LDMOS) transistor device having a bipolar transistor for electrostatic discharge (ESD) protection, the method comprising:
   doping a substrate to form a body region of the LDMOS transistor device in the substrate, the body region having a first conductivity type;
   forming a doped isolating region of the LDMOS transistor device in the substrate to define a collector region of the bipolar transistor, the doped isolating region having a second conductivity type and surrounding a device area of the LDMOS transistor device in which the body region is disposed;
   forming a base contact region of the bipolar transistor, the base contact region being disposed within the body region and having the first conductivity type; and
   doping the substrate to form an isolation contact region for the doped isolating region, to form source and drain regions of the LDMOS transistor device in the substrate, and to form an emitter region of the bipolar transistor spaced from the source region within the body region;
   wherein:
      the source and drain regions are spaced from one another to define a conduction path that passes through the body region; and
      the doped isolating region and the body region are spaced from one another to establish a first breakdown trigger voltage level of the bipolar transistor lower than a second breakdown voltage level of the LDMOS transistor device along the conduction path.

6. The method of claim 5, wherein doping the substrate to form the body region comprises:
   forming a first well in which a channel is formed along the conduction path during operation; and
   forming a second well adjacent the first well and spaced from the doped isolating region to establish the first breakdown trigger voltage level.

7. The method of claim 6, wherein:
   the source region is disposed within the first well; and
   the base contact and emitter regions are disposed within the second well.

8. The method of claim 6, wherein the doped isolating region is configured as a ring surrounding the device area and spaced from the body region to establish the first breakdown trigger voltage level.

9. A method of fabricating a laterally diffused metal-oxide-semiconductor (LDMOS) transistor device having a bipolar transistor for electrostatic discharge (ESD) protection, the method comprising:
   doping a substrate to form a body region of the LDMOS transistor device in the substrate, the body region having a first conductivity type;
   forming a doped isolating region of the LDMOS transistor device in the substrate to define a collector region of the bipolar transistor, the doped isolating region having a second conductivity type and surrounding a device area of the LDMOS transistor device in which the body region is disposed;
   forming a base contact region of the bipolar transistor, the base contact region being disposed within the body region and having the first conductivity type; and
   doping the substrate to form an isolation contact region for the doped isolating region, to form source and drain regions of the LDMOS transistor device in the substrate, and to form an emitter region of the bipolar transistor spaced from the source region within the body region;
   forming a shallow trench isolation (STI) region along the substrate such that the STI region is disposed between the base contact region and the emitter region.

10. A method of fabricating a laterally diffused metal-oxide-semiconductor (LDMOS) transistor device having a bipolar transistor for electrostatic discharge (ESD) protection, the method comprising:
   doping a substrate to form a body region of the LDMOS transistor device in the substrate, the body region having a first conductivity type;
   forming a doped isolating region of the LDMOS transistor device in the substrate to define a collector region of the bipolar transistor, the doped isolating region having a second conductivity type and surrounding a device area of the LDMOS transistor device in which the body region is disposed;
   forming a base contact region of the bipolar transistor, the base contact region being disposed within the body region and having the first conductivity type; and
   doping the substrate to form an isolation contact region for the doped isolating region, to form source and drain regions of the LDMOS transistor device in the substrate, and to form an emitter region of the bipolar transistor spaced from the source region within the body region;
   wherein forming the doped isolating region comprises:
      forming an isolation well in which the isolation contact region is disposed;
      forming a buried isolation layer in the substrate extending across the active area; and
      forming a link region in the substrate coupling the isolation well and the buried isolation layer;
      wherein the link region extends laterally inward beyond the isolation well and toward the body region to define a spacing between the body region and the link region that establishes a first breakdown voltage level.

11. A method of fabricating a laterally diffused metal-oxide-semiconductor (LDMOS) transistor device having a bipolar transistor for electrostatic discharge (ESD) protection, the method comprising:
   doping a substrate to form a body region of the LDMOS transistor device in the substrate, the body region having a first conductivity type;
   forming a doped isolating region of the LDMOS transistor device in the substrate to define a collector region of the bipolar transistor, the doped isolating region having a second conductivity type and surrounding a device area of the LDMOS transistor device in which the body region is disposed;

forming a base contact region of the bipolar transistor, the base contact region being disposed within the body region and having the first conductivity type; and doping the substrate to form an isolation contact region for the doped isolating region, to form source and drain regions of the LDMOS transistor device in the substrate, and to form an emitter region of the bipolar transistor spaced from the source region within the body region;

wherein the base contact region is disposed between the source region and the emitter regions.

12. A method of fabricating a laterally diffused metal-oxide-semiconductor (LDMOS) transistor device having a bipolar transistor for electrostatic discharge (ESD) protection, the method comprising:

doping a substrate to form a body region of the LDMOS transistor device in the substrate, the body region having a first conductivity type;

forming a doped isolating region of the LDMOS transistor device in the substrate to define a collector region of the bipolar transistor, the doped isolating region having a second conductivity type and surrounding a device area of the LDMOS transistor device in which the body region is disposed; and doping the substrate to form source and drain regions of the LDMOS transistor device in the substrate, and to form an emitter region of the bipolar transistor within the body region;

wherein the source and drain regions are spaced from one another to define a conduction path that passes through the body region, and wherein the doped isolating region and the body region are spaced from one another to establish a first breakdown trigger voltage level of the bipolar transistor lower than a second breakdown voltage level of the LDMOS transistor device along the conduction path.

13. The method of claim 12, wherein the emitter region is disposed between the source region and the doped isolating region.

14. The method of claim 12, further comprising forming a shallow trench isolation (STI) region along the substrate such that the STI region is disposed between the source region and the emitter region.

15. The method of claim 12, further comprising depositing a metal layer to form an interconnect configured to electrically tie the body region and the emitter region to one another.

16. The method of claim 12, wherein forming the doped isolating region comprises:

forming an isolation well;

forming a buried isolation layer in the substrate extending across the active area; and forming a link region in the substrate coupling the isolation well and the buried isolation layer;

wherein the link region extends laterally inward beyond the isolation well and toward the body region to define a spacing between the body region and the link region that establishes a first breakdown voltage level.

17. The method of claim 12, wherein doping the substrate to form the body region comprises:

forming a first well in which a channel is formed along the conduction path during operation; and forming a second well adjacent the first well and spaced from the doped isolating region to establish the first breakdown trigger voltage level.

18. The method of claim 12, wherein doping the substrate to form the body region comprises:

forming a first well in which the source region is formed; and forming a second well adjacent the first well and in which the emitter region is formed.

19. The method of claim 12, further comprising implanting dopant of the second conductivity type to form a drift region in the substrate, wherein:

the drain region is disposed in the drift region; and the drift region is spaced from the doped isolating region.

20. The method of claim 12, wherein the body region and the doped isolating region are spaced from one another by a portion of the substrate having the first conductivity type.

* * * * *